United States Patent [19]

Naghshineh

[11] Patent Number: 5,072,136
[45] Date of Patent: Dec. 10, 1991

[54] ECL OUTPUT BUFFER CIRCUIT WITH IMPROVED COMPENSATION

[75] Inventor: Kianoosh Naghshineh, Menlo Park, Calif.

[73] Assignee: Advanced Micro Devices, Inc., Sunnyvale, Calif.

[21] Appl. No.: 509,916

[22] Filed: Apr. 16, 1990

[51] Int. Cl.⁵ ............................................. H03K 3/01
[52] U.S. Cl. ................................. 307/455; 307/355; 307/356; 307/310; 307/491
[58] Field of Search ............... 307/455, 355, 356, 310, 307/491

[56] References Cited

U.S. PATENT DOCUMENTS

| | | | |
|---|---|---|---|
| 4,745,304 | 5/1988 | Wilson | 307/310 |
| 4,748,346 | 5/1988 | Emori | 307/455 |
| 4,751,406 | 6/1988 | Wilson | 307/455 |
| 4,870,301 | 9/1989 | Petty | 307/455 |
| 4,980,579 | 12/1990 | McDonald et al. | 307/356 |
| 5,003,199 | 3/1991 | Chueng et al. | 307/455 |
| 5,013,941 | 5/1991 | Jensson | 307/455 |
| 5,025,179 | 6/1991 | Freitas | 367/455 |

FOREIGN PATENT DOCUMENTS 0009134  1/1982  Japan .................................. 307/455

*Primary Examiner*—Stanley D. Miller
*Assistant Examiner*—Scott A. Ouellette
*Attorney, Agent, or Firm*—Davis Chin

[57] ABSTRACT

An ECL output buffer circuit for generating a stable predetermined output voltage over power supply, temperature and process variations and having a high speed of operation with low power consumption includes a differential pair formed of first and second input transistors (Q102, Q103), an emitter follower transistor (Q101), a first current source (112), and a second current source (114). The first current source is coupled to the base of the emitter follower transistor for generating a compensating current. The second current source is coupled to the emitters of the first and second input transistors for generating a gate current.

15 Claims, 3 Drawing Sheets

ECL OUTPUT BUFFER CIRCUIT WITH IMPROVED COMPENSATION

BACKGROUND OF THE INVENTION

This invention relates generally to output buffer circuits and more particularly, it relates to an ECL output buffer circuit which provides a stable predetermined output voltage swing over power supply, temperature and process variations but yet has a high speed of operation with low power consumption.

As is generally known in the art of output buffer circuits, it is generally desirable to maintain accurately the D.C. output voltage level $V_{OH}$ corresponding to the high logic level and the D.C. voltage output level $V_{OL}$ corresponding to the low logic level in order to achieve high operating speeds, adequate noise margins and low power consumption and to prevent the output voltages from being affected by variations in process, power supply voltages, and temperature. In particular, this is especially important so as to avoid saturation of the internal transistors when designing the output levels for a "lower-than-low" operation, i.e., where the output level is lower than the normal low logic level $V_{OL}$. Therefore, there is generally required some sort of compensation circuit to produce a compensating current $I_{COMP}$ in order to make the output voltages independent of supply-voltage variations and temperature variations.

In FIG. 1, there is shown an ECL output buffer circuit of the prior art which includes a compensation circuit to provide a compensating current $I_{COMP}$ for the output voltage level $V_{OH}$. The values of compensating current $I_{COMP}$ varies over the temperature range. Since the values of the compensating current $I_{COMP}$ are a definite function of the temperature coefficients of the resistors R1, R10, R9, R8; the transistors Q3, Q4; and the gate current $I_G$, and further since the temperature coefficients of the resistors and transistors are fixed by process, then a predetermined output voltage level $V_{OH}$ or $V_{OL}$ can be obtained only by changing the gate current $I_G$. With this compensation scheme, a very high gate current $I_G$ is required and thus causing higher power consumption. Further, due to the close relationship of the compensating current $I_{COMP}$ and the gate current $I_G$ this makes the design very difficult and greatly dependent on process tolerances. It would therefore be desirable to provide an improved ECL output buffer circuit which provides a stable predetermined output voltage swing over power supply, temperature and process variation.

SUMMARY OF THE INVENTION

Accordingly, it is a general object of the present invention to provide an improved ECL output buffer circuit which overcomes the disadvantages of the prior art output buffers.

It is an object of the present invention to provide an improved ECL output buffer circuit which has a stable predetermined output voltage swing over power supply, temperature and process variations.

It is another object of the present invention to provide an improved ECL output buffer circuit which has a higher speed of operation with lower power consumption than has been traditionally available.

It is still another object of the present invention to provide an improved ECL output buffer circuit which includes a first current source for generating a compensating current and a second current source for generating a gate current.

It is yet still another object of the present invention to provide an improved ECL output buffer circuit which includes first and second stable bandgap reference voltage generators for controlling accurately and independently the output voltage levels $V_{OH}$ and $V_{OL}$.

In accordance with these aims and objectives, the present invention is concerned with the provision of an ECL output buffer circuit which provides a stable predetermined output voltage swing over power supply, temperature and process variations and has a high speed of operation with low power consumption. The ECL output buffer circuit includes a differential pair formed of first and second input transistors, an emitter follower transistor, a first current source, and a second current source. The first and second input transistors have their emitters connected together. The first input transistor has its base connected to receive a true input logic signal and its collector connected to a first power supply potential via a first load resistor. The second input transistor has its base connected to receive a complementary input logic signal and its collector connected to the first power supply potential via a second load resistor.

The emitter follower transistor has its collector connected to a ground potential, its base connected to the collector of the second input transistor, and its emitter connected to an output terminal for generating the stable output voltage swinging between a high logic level output and a low logic level output. The first current source is coupled between the base of the emitter follower transistor and a second supply potential for generating a compensating current. The second current source is coupled between the common emitters of the first and second input transistors and the second supply potential for generating a gate current.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
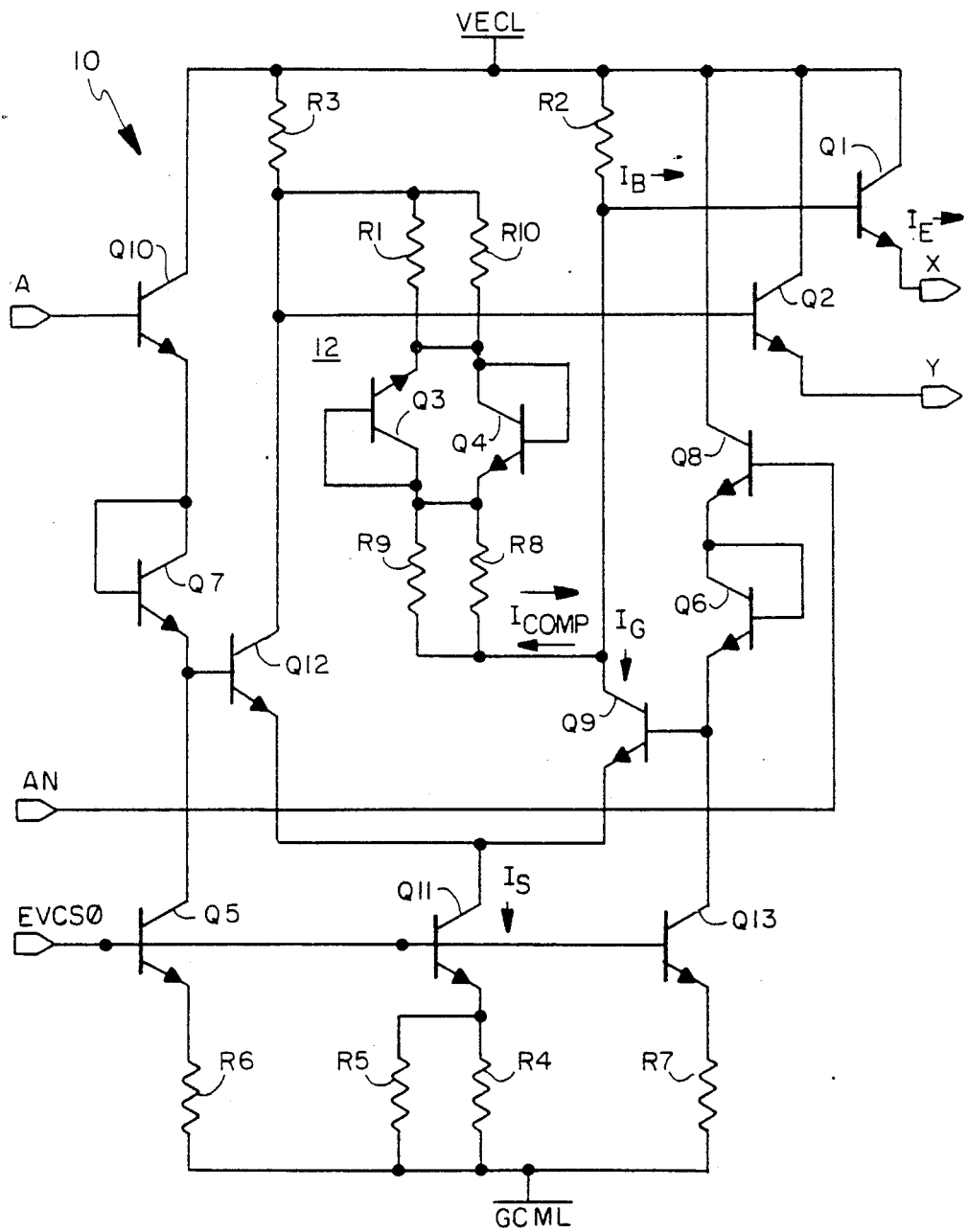
FIG. 1 is a schematic circuit diagram of an ECL output buffer circuit of the prior art.

Referring now in detail to the drawings, there is shown in FIG. 1 a schematic circuit diagram of a conventional prior art ECL output buffer circuit 10 which includes compensation network 12 to provide a high logic level output $V_{OH}$ that has a fixed temperature coefficient. The buffer circuit 10 includes a differential pair formed of first and second input transistors Q12, Q9; a current source formed of a transistors Q11 and resistors R4, R5; load resistors R2, R3; an emitter follower transistor Q1; and the compensation network 12. The compensation network 12 consists of diode-connected transistors Q3, Q4 and resistors R1, R8, R9 and R10. The emitter of the transistors Q1 is connected to an output terminal X to provide high and low logic level output voltages ($V_{OH}$ and $V_{OL}$) when the transistor Q9 is turned off and on.

Figure 2:
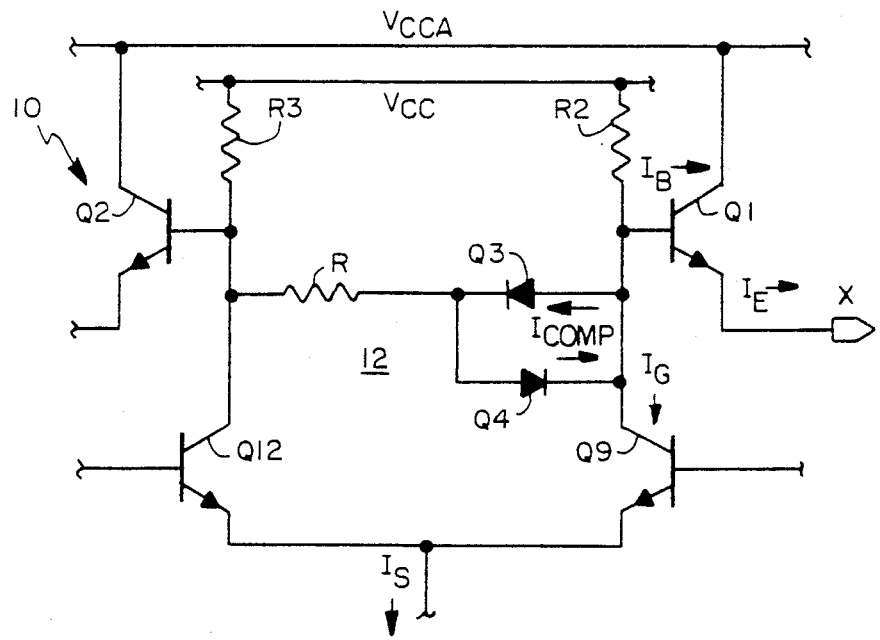
FIG. 2 is a simplified version of the buffer circuit of FIG. 1.

In FIG. 2, there is shown a simplified version of the buffer circuit 10 of FIG. 1 where like reference numerals have been used to identify like parts. The high logic level output $V_{OH}$ and the low logic level output $V_{OL}$ are defined by respective equations (1) and (2) below:

$$V_{OH} = -I_B R_2 - V_{BE(Q1)}(I_E) - I_{COMP} R_2 \quad (1)$$

$$V_{OL} = -I_B R_2 - V_{BE(Q1)}(I_E) - I_G R_2 - I_{COMP} R_2 \quad (2)$$

where,
- $I_B$ is the base current and is a process and temperature dependent term.
- $I_E$ is the output drive current that is determined by external termination of the terminal X.
- $I_{COMP}$ is the compensating current which is drawn through the resistor R so as to adjust the high and low output levels to be within a specified range and has different values for high and low temperatures.
- $I_G$ is the gate current which is switched off for the high output level $V_{OH}$ and is switched on for the low output level $V_{OL}$.

Thus, the compensation network 12 consisting of diode-connected transistors Q3, Q4 and a resistor R (corresponding to lumping together of resistors R1, R8, R9 and R10) is used to provide a high output level $V_{OH}$ having a fixed temperature coefficient by controlling the temperature coefficient of a current source $I_S$. However, the design of a current source $I_S$ having a precise temperature coefficient is difficult to achieve. Further, due to the connection of the compensation circuit 12 between the collectors of the first and second input transistors Q12 and Q9, the gate current $I_G$ will be a function of the compensating current $I_{COMP}$ so as to affect the low logic level output voltage $V_{OL}$. Therefore, there is no separate control over the low logic level output voltage $V_{OL}$. Moreover, almost no compensating current $I_{COMP}$ is required at cold temperatures. Thus, the ratio of $I_{COMP(HOT)}/I_{COMP(COLD)}$ will be very large. The only way to realize this is to provide a very high gate current $I_G$.

Figure 3:
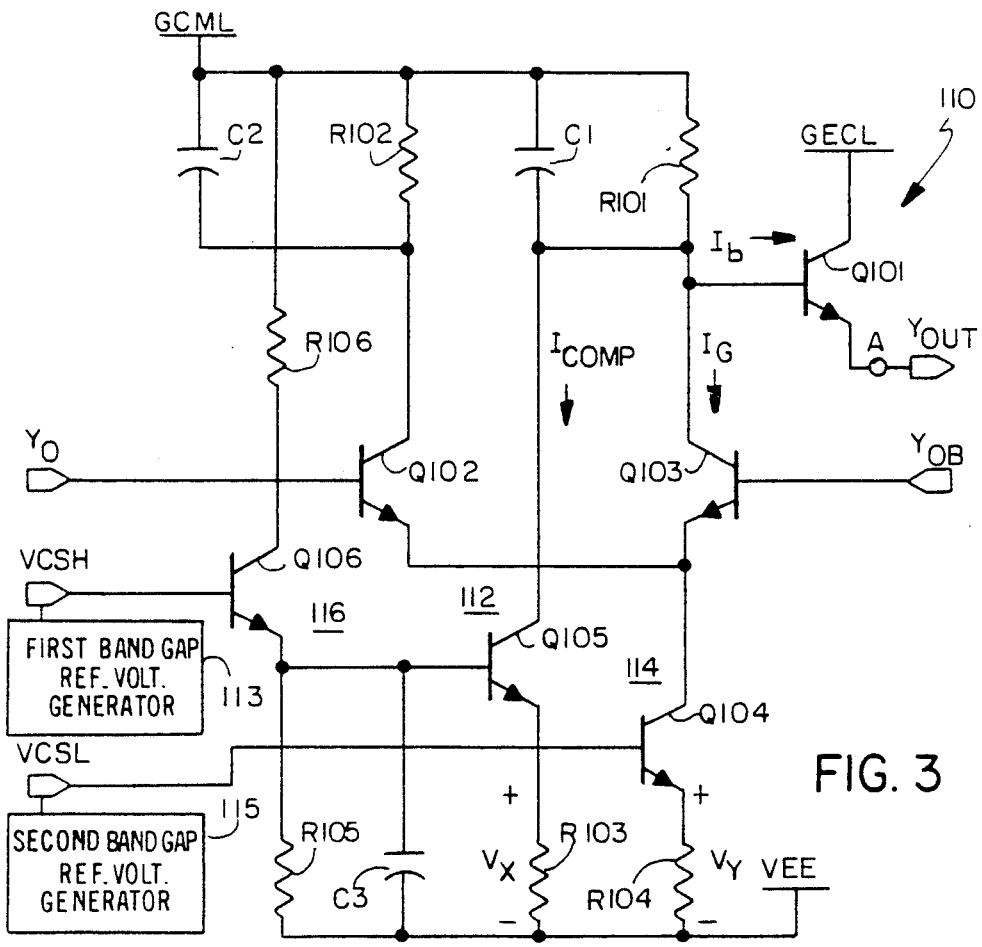
FIG. 3 is a schematic circuit diagram of an ECL output buffer circuit, constructed in accordance with the principles of the present invention.

Referring now to FIG. 3 of the drawings, there is shown a schematic circuit diagram of an ECL output buffer circuit 110 which is constructed in accordance with the principles of the present invention. The output buffer circuit 110 is comprised of a differential pair formed of first and second input transistor Q102, Q103; load resistors R101, R102; an emitter follower transistor Q101; a first accurately controlled temperature-compensated current source 112; and a second accurately controlled temperature-compensated current source 114.

The first input transistor Q102 has its base connected to receive a true input logic signal $Y_O$, its collector connected to a first supply potential GCML via the load resistor R102, and its emitter connected to the emitter of the second input transistor Q103. The first supply potential GCML is typically at zero volts. The second transistor Q103 has its base connected to a complementary input logic signal $Y_{OB}$ and its collector connected to the first power supply potential GCML via the load resistor R101 and to the base of the emitter follower transistor Q101. The transistor Q101 has its collector connected to a ground potential GECL and its emitter connected to an output terminal A which provides an output signal $Y_{OUT}$. When the transistor Q103 is turned off, the output signal $Y_{OUT}$ is defined to be at the high logic level $V_{OH}$. When the transistor Q103 is turned on, the output signal $Y_{OUT}$ is defined to be at the low logic level $V_{OL}$.

The first temperature-compensated current source 112 is formed of a current source transistor Q105 and a resistor R103. The current source transistor Q105 has its collector connected also to the base of the emitter follower transistor Q101, its base coupled to receive a first stable bandgap voltage $V_{CSH}$ via a first bandgap reference voltage generator 113, and its emitter connected to a second power supply potential VEE via the resistor R103. The second power supply potential is typically at −5.2 or −4.5 volts. A level shifter 116 is formed of a level-shifting transistor Q106 and resistors R105, R106. The level-shifting transistor Q106 has its base connected to receive the first stable bandgap voltage $V_{CSH}$, its collector connected to the first power supply potential GCML via the resistor R106, and its emitter connected to the second power supply potential VEE via the resistor R105 and to the base of the current source transistor Q105.

The second temperature-compensated current source 114 is formed of a current source transistor Q104 and a resistor R104. The transistor Q104 has its collector connected to the common emitters of the first and second input transistors Q102, Q103 and its emitter connected to the second power supply potential VEE via the resistor R104. The base of the transistor Q104 is connected to receive a second stable bandgap voltage $V_{CSL}$ from a second bandgap reference voltage generator 115. The first band-gap generator 113 and the second bandgap generator 115 are of conventional design which is well known in the art.

A first capacitor C1 is connected in parallel with the load resistor R101. A second capacitor C2 is connected in parallel with the load resistor R102. A third capacitor C3 is connected in parallel with the resistor R105. The capacitor C1 determines the rising and falling edge rates at the base of the emitter follower transistor Q101. The capacitor C2 has been added to provide symmetry. The capacitor C3 is utilized to provide stability at the base of the current source transistor Q105. Each of the capacitors C1–C3 may be formed conventionally of a transistor in which the collector and emitter electrodes are connected together to define one plate of the capacitor and the base electrode defines the other capacitor plate.

A simple circuit analysis of FIG. 3 yields the following equation, which is the high logic level output $V_{OH}$ when the transistor Q103 is turned off:

$$V_{OH} = -(I_{COMP})(R_{101}) - V_{BE(Q101)} - I_b(R_{101}) \quad (3)$$

where,
- $I_{COMP}$ is the compensating current flowing in the collector of transistor Q105.
- $I_b$ is the base current flowing in the base of transistor Q101.
- $V_{BE(Q101)}$ is the base-to-emitter drop across the transistor Q101.

However, the compensating current $I_{COMP}$ is equal to the voltage $V_X$ across the resistor R103 divided by the resistance value of the resistor R103, or $V_X/R103$. Further, the voltage $V_X$ is equal to the first stable bandgap voltage $V_{CSH}$ minus the base-to-emitter drops of the transistors Q106 and Q105, or $V_{CSH} - V_{BE(Q106)} -$ $V_{BE(Q105)}$ or $V_{CSH} - 2V_{BE}$. By substituting these values for $I_{COMP}$ and $V_X$ into equation (3), there is given:

$$V_{OH} = -(V_{CSH} - 2V_{BE})\frac{R101}{R103} - V_{BE(Q101)} - I_b(R101) \quad (4)$$

By assuming that the base current $I_b$ of the transistor Q101 to be relatively small or negligible, it can thus be seen that the voltage $V_{OH}$ is determined by the ratio of the resistors R101 and R103 as well as by the values of $V_{CSH}$ and $V_{BE}$, which can be controlled very accurately. Further, it will be noted that the since resistors R101 and R103 cancel, their temperature coefficient as well as process variations play no part in determining the value of the voltage $V_{OH}$. Consequently, the first stable bandgap voltage $V_{CSH}$ can be designed to provide a controlled and predetermined temperature sensitivity for the voltage $V_{OH}$. Further, it will be noted that there is no power supply voltage dependent term or process dependent term in equation (4) since $V_{BE}$ is a weak function of process variation. Thus, the voltage $V_{OH}$ is substantially power supply voltage independent and independent of process variations.

Similarly, the low logic level output $V_{OL}$ when the transistor Q103 is turned on, is given by an analysis of FIG. 3 and is given by the following equation:

$$V_{OL} = -(I_{COMP})(R_{101}) - I_b(R101) - I_G(R101) - V_{BE(Q101)} \quad (5)$$

where, $I_{COMP}$ is the compensating current flowing in the collector of transistor Q105.

$I_b$ is the base current flowing in the base of transistor Q101.

$V_{BE(Q101)}$ is the base-to-emitter drop across the transistor Q101.

$I_G$ is the gate current following in the collector of the transistor Q103.

However, the compensating current $I_{COMP}$ is again equal to the voltage $V_X$ across the resistor R103 divided by the resistance value of the resistor R103, or $V_X/R103$. Further, the gate current $I_G$ is equal to the voltage $V_Y$ across the resistor R104 divided by the resistance value of the resistor R104 or $V_Y/R104$. But the voltage $V_Y$ is equal to the second stable bandgap voltage $V_{CSL}$ minus the base-to-emitter drop of the transistor Q104 or $V_{CSH} - V_{BE}$. By substituting these values for $I_{COMP}$, $V_X$ and $V_Y$ into equation (5), there is given:

$$V_{OL} = -(V_{CSH} - 2V_{BE})\frac{R101}{R103} - \quad (6)$$
$$I_b(R101) - (V_{CSL} - V_{BE})\frac{R101}{R104} - V_{BE(Q101)}$$

It will be noted that the first term in equation (6) is the same as the first term in equation (4) and has already been fixed for the high logic level $V_{OH}$. Again, assuming that the base current $I_b$ of the transistor Q101 is to be relatively small or negligible, it can be seen that the voltage $V_{OL}$ is determined by the ratio of the resistors R101 and R104 as well as by the values of $V_{CSL}$ and $V_{BE}$ which can be controlled very accurately. Further, it will be noted that since the resistors R101 and R104 cancel, their temperature coefficient as well as process variations play no part in determining the value of the voltage $V_{OL}$. As a result, the second stable bandgap voltage $V_{CSL}$ can be designed to provide a controlled and predetermined temperature sensitivity for the voltage $V_{OL}$. Further, it will be noted that there is no power supply voltage dependent term or process dependent term in equation (6) since $V_{BE}$ is a weak function of process variation. Therefore, the voltage $V_{OL}$ is substantially power supply independent and independent of process variations.

Figure 4:
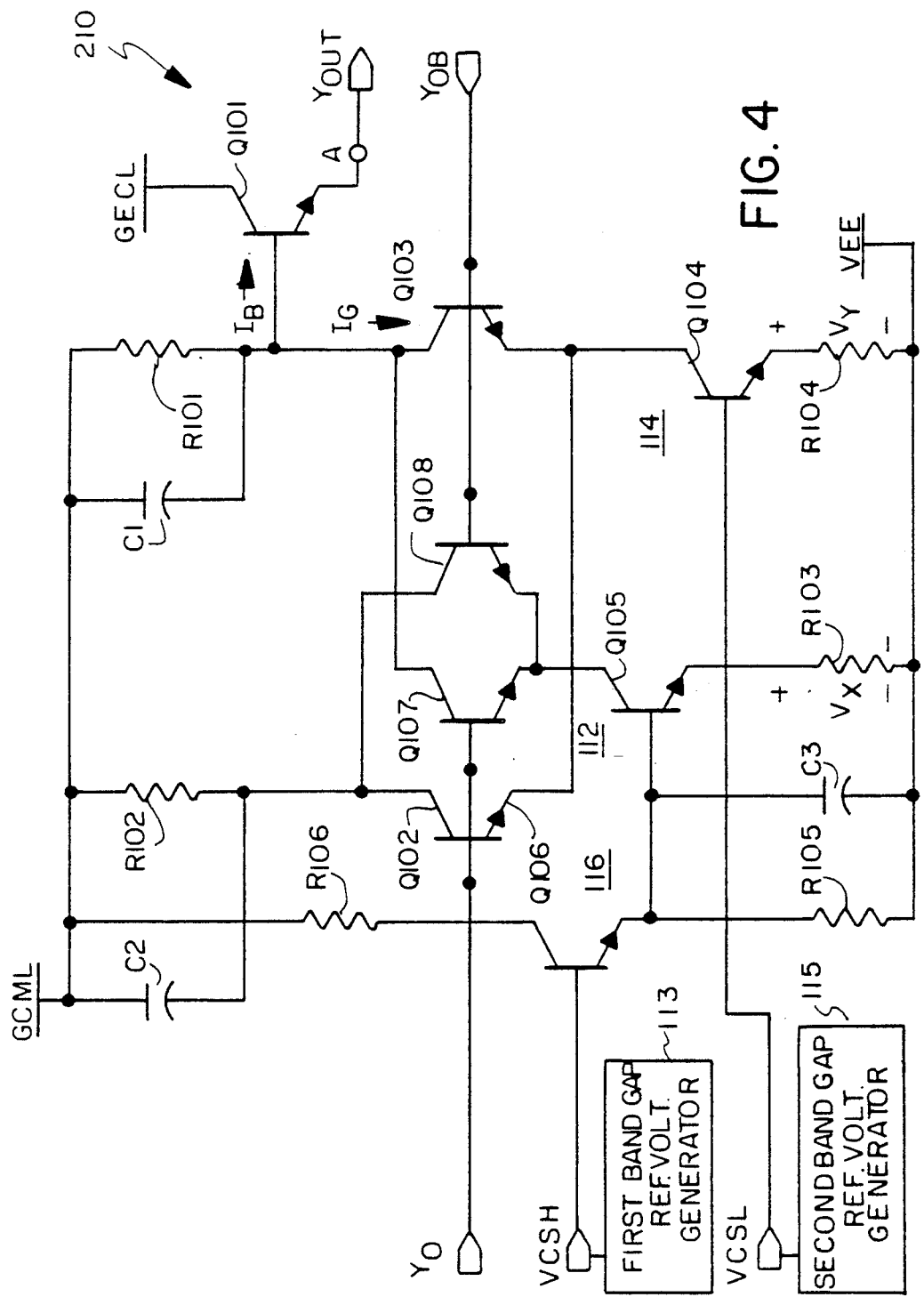
FIG. 4 is a schematic circuit diagram of a second embodiment of an ECL output buffer circuit.

As can be seen from equations (4) and (6), the high logic level $V_{OH}$ is independent of the low logic level $V_{OL}$, but the low logic level $V_{OL}$ is dependent upon the high logic level $V_{OH}$. In order to provide for further separation, the compensating current $I_{COMP}$ is routed through a differential pair formed of third and fourth input transistors Q107 and Q108 added to FIG. 3, which is illustrated in the second embodiment of the present invention in FIG. 4. In particular, the third input transistor Q107 has its base connected to receive the true input logic signal $Y_O$ and its collector connected to the collector of the second input transistor Q103. The fourth input transistor Q108 has its base connected to receive the complementary input logic signal $Y_{OB}$ and its collector connected to the collector of the first input transistor Q102. The emitter of the transistors Q107 and Q108 are connected together and to the collector of the current source transistor Q105. Except for these differences, the operation of the ECL output buffer circuit 210 of FIG. 4 is quite similar to FIG. 3. Therefore, a detailed discussion of the operation of FIG. 4 will not be presented.

The primary advantage of the present invention is that it provides for improved compensation with respect to process, power supply, and temperature variations over the prior art ECL buffer circuit 10 of FIG. 1. The compensating technique of the present invention eliminates the need of designing a current source $I_S$ having a temperature coefficient that must be critically controlled. In the implementation of the present ECL buffer circuit, there are provided two accurately controlled current sources for generating the respective compensating current $I_{COMP}$ and gate current $I_G$.

Specifically, the ECL output buffer circuits 110 and 210 of the present invention have the following advantages over he prior art design;

(a) they require negligible current demand from the first bandgap generator 113 due to the small value of the compensating current $I_{COMP}$ and the gain stage formed by the transistors Q105 and Q106, thereby allowing the same bandgap generator 113 to power the whole chip;

(b) they require less chip power for a given number of buffer circuits on a chip since the current demand on the bandgap generator is less (due to smaller gate current $I_G$) and thus a fewer number of bandgap generators are needed, thereby saving power consumption;

(c) they allow the high logic level output $V_{OH}$ and the low logic level $V_{OL}$ to be separately controlled by adjusting independently the respective bandgap voltages $V_{CSH}$ and $V_{CSL}$;

(d) they allow different predetermined output swings to be produced by only adjusting the bandgap voltages $V_{CSH}$ and $V_{CSL}$ without requiring circuit component modifications; and (e) they utilize a minimal amount of current to be switched so as to relax the requirement on the sizes of the input transistors Q102, Q103 and the magnitude of the input signals $Y_O$, $Y_{OB}$, thereby increasing its speed of operation.

From the foregoing detailed description, it can thus be seen that the present invention provides an improved ECL output buffer circuit which provides a stable output voltage swing over power supply, temperature and process variations. Further, the present ECL output buffer circuit has a higher speed of operation with lower power dissipation than has been traditionally available. The ECL output buffer circuit of the present invention includes a first current source for generating a compensating current $I_{COMP}$ and a second current source for generating a gate current $I_G$.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best mode contemplated for carrying out the invention, but that the invention will include all embodiments falling within the scope of the appended claims.

What is claimed is:

1. An ECL output buffer circuit for generating a stable predetermined output voltage swing over power supply, temperature and process variations which has a high speed of operation with low power consumption comprising:

a differential pair formed of first and second input transistors (Q102, Q103) having their emitters connected together, said first input transistor (Q102) having its base connected to receive a true input logic signal and its collector connected to a first supply potential (GCML) via a first load resistor (R102), said second input transistor (Q103) having its base connected to receive a complementary input logic signal and its collector connected to the first supply potential (GCML) via a second load resistor (R101);

an emitter follower transistor (Q101) having its collector connected to a ground potential (GECL), its base connected to the collector of said second input transistor (Q103), its emitter connected to an output terminal for generating the stable output voltage swinging between a high logic level and a low logic level;

first current source means (112) coupled between the base of said emitter follower transistor (Q101) and a second supply potential (VEE) for generating a compensating current;

second current source means (114) coupled between the common emitters of said first and second input transistors (Q102, Q103) and the second supply potential (VEE) for generating a gate current;

said first current source means (112) being formed of a first current source transistor (Q105) and a first emitter resistor (R103), said first current source transistor (Q105) having its collector connected to the base of said emitter follower transistor (Q101), its base coupled to receive a first stable reference voltage ($V_{CSH}$), and its emitter connected to one end of the first emitter resistor (R103), the other end of the first emitter resistor (R103) being connected to the second supply potential (VEE); and said first reference voltage being generated by a first bandgap reference voltage generator (113).

2. An ECL output buffer circuit as claimed in claim 1, wherein said second current source means (114) is formed of a second current source transistor (Q106) and a second emitter transistor (R104), said second current source transistor (Q104) having its collector connected to the common emitters of said first and second input transistors (Q102, Q103), its base connected to receive a second stable reference voltage ($V_{CSL}$), and its emitter connected to one end of the second emitter resistor (R104), the other end of the second emitter resistor (R104) being connected to the second supply potential (VEE).

3. An ECL output buffer circuit as claimed in claim 2, wherein said second stable reference voltage is generated by a second bandgap reference voltage generator (115).

4. An ECL output buffer circuit as claimed in claim 1, wherein said second current source means (114) is switched off for generating the high output level and is switched on for generating the low output level.

5. An ECL output buffer circuit as claimed in claim 1, further comprising level shifting means (116) interconnecting said first reference voltage and the base of said first current source transistor (Q105).

6. An ECL output buffer circuit as claimed in claim 5, wherein said level-shifting means (116) is formed of a third transistor (Q106) and an emitter resistor (R105), said third transistor having its collector coupled to the first supply potential (GCML) via a load resistor (R106), its base connected to receive the first stable reference voltage ($V_{CSH}$) and its emitter connected to one end of the emitter resistor (R105) and to the base of the first current source transistor (Q105), the other end of the emitter resistor (R105) being connected to the second supply potential (VEE).

7. An ECL output buffer circuit as claimed in claim 6, wherein said first power supply potential (GCML) is at typically zero volts and wherein said second supply potential is at typically −5.2 volts.

8. An ECL output buffer circuit for generating a stable predetermined output voltage swing over power supply, temperature and process variations which has a high speed of operation with low power consumption comprising:

a differential pair formed of first and second input transistors (Q102, Q103) having their emitters connected together, said first input transistor (Q102) having its base connected to receive a true input logic signal and its collector connected to a first supply potential (GCML) via a first load resistor (R102), said second input transistor (Q103) having its base connected to receive a complementary input logic signal and its collector connected to the first supply potential (GCML) via a second load resistor (R101);

an emitter follower transistor (Q101) having its collector connected to a ground potential (GECL), its base connected to the collector of said second input transistor (Q103), its emitter connected to an output terminal for generating the stable output voltage swinging between a high logic level and a low logic level;

first compensating means (112) coupled between the base of said emitter follower transistor (Q101) and a second supply potential (VEE) for generating a compensating current;

second compensating means (114) coupled between the common emitters of said first and second input transistors (Q102, Q103) and the second supply potential (VEE) for generating a gate current;

said first compensating means (112) being formed of a current source transistor (Q105) and an emitter resistor (R103), said current source transistor (Q105) having its collector connected to the base of said emitter follower transistor (Q101), its base coupled to receive a first stable reference voltage ($V_{CSH}$), and its emitter connected to one end of the emitter resistor (R103), the other end of the emitter resistor (R103) being connected to the second supply potential (VEE); and said first reference voltage being generated by a first bandgap reference voltage generator (113).

9. An ECL output buffer circuit as claimed in claim 8, wherein said second compensating means (114) is formed of a current source transistor (Q106) and an emitter transistor (R104), said current source transistor (Q104) having its collector connected to the common emitters of said first and second input transistors (Q102, Q103), its base connected to receive a second stable reference voltage ($V_{CSL}$), and its emitter connected to one end of the emitter resistor (R104), the other end of the emitter resistor (R104) being connected to the second supply potential (VEE).

10. An ECL output buffer circuit as claimed in claim 9, wherein said second stable reference voltage is generated by a second bandgap reference voltage generator (115).

11. An ECL output buffer circuit as claimed in claim 8, wherein said second compensating means (114) is switched off for generating the high output level and is switched on for generating the low output level.

12. An ECL output buffer circuit as claimed in claim 8, further comprising level shifting means (116) interconnecting said first reference voltage and the base of said first current source transistor (Q105).

13. An ECL output buffer circuit as claimed in claim 12, wherein said level-shifting means (116) is formed of a third transistor (Q106) and an emitter resistor (R105), said third transistor having its collector coupled to the first supply potential (GCML) via a load resistor (R106), its base connected to receive the first stable reference voltage ($V_{CSH}$) and its emitter connected to one end of the emitter resistor (R105) and to the base of the first current source transistor (Q105), the other end of the emitter resistor (R105) being connected to the second supply potential (VEE).

14. An ECL output buffer circuit as claimed in claim 8, wherein said first power supply potential (GCML) is at typically zero volts and wherein said second supply potential is at typically −5.2 volts.

15. An ECL output buffer circuit comprising:
output transistor means (Q101) for generating a stable predetermined output voltage swinging between a high logic level and a low logic level;
first differential means (Q102, Q103) responsive to input logic signals for switching off and on said output transistor means to provide the high and low logic levels;
first compensating means (112) coupled to said output transistor means for generating a compensating current;
second differential means (Q107, Q108) responsive to said input logic signals for selectively coupling said first compensating means to said output transistor means;
second compensating means (114) coupled to said first differential means for generating a gate current;
first bandgap generator means (113) coupled to said first compensating means (112); and
second bandgap generator means (115) coupled to said second compensating means (114).

* * * * *